United States Patent
Chen et al.

(10) Patent No.: US 9,984,989 B2
(45) Date of Patent: May 29, 2018

(54) SEMICONDUCTOR SUBSTRATE AND SEMICONDUCTOR PACKAGE STRUCTURE

(71) Applicant: Advanced Semiconductor Engineering, Inc., Kaohsiung (TW)

(72) Inventors: Tien-Szu Chen, Kaohsiung (TW); Sheng-Ming Wang, Kaohsiung (TW); Kuang-Hsiung Chen, Kaohsiung (TW); Yu-Ying Lee, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days. days.

(21) Appl. No.: 14/855,849

(22) Filed: Sep. 16, 2015

(65) Prior Publication Data
US 2016/0079194 A1   Mar. 17, 2016

(30) Foreign Application Priority Data
Sep. 17, 2014  (CN) .......................... 2014 1 0474198

(51) Int. Cl.
| | |
|---|---|
| *H01L 23/49* | (2006.01) |
| *H01L 23/00* | (2006.01) |
| *H01L 23/31* | (2006.01) |
| *H01L 21/48* | (2006.01) |
| *H01L 23/498* | (2006.01) |

(52) U.S. Cl.
CPC .......... *H01L 24/14* (2013.01); *H01L 21/4846* (2013.01); *H01L 21/4853* (2013.01);
(Continued)

(58) Field of Classification Search
CPC ... H01L 24/14; H01L 24/13; H01L 23/49816; H01L 23/49827; H01L 23/562
See application file for complete search history.

(56) References Cited

U.S. PATENT DOCUMENTS 5,759,047 A * 6/1998 Brodsky ........... H01L 23/49811
439/66
6,524,115 B1 * 2/2003 Gates .................. G01R 1/0408
439/66
(Continued)

FOREIGN PATENT DOCUMENTS

| CN | 1577813 A | 2/2005 |
| CN | 102842510 A | 12/2012 |
| CN | 103000593 A | 3/2013 |

OTHER PUBLICATIONS

Search Report for Chinese Patent Application No. 201410474198.7, dated Sep. 1, 2017, 1 page.

*Primary Examiner* — Matthew Reames
(74) *Attorney, Agent, or Firm* — Foley & Lardner LLP; Cliff Z. Liu

(57) ABSTRACT

A semiconductor substrate includes an insulating layer, a first conductive patterned layer disposed adjacent to a first surface of the insulating layer, and conductive bumps disposed on the first conductive patterned layer. Each conductive bump has a first dimension along a first direction and a second dimension along a second direction perpendicular to the first direction, and the first dimension is greater than the second dimension. A semiconductor package structure includes the semiconductor substrate, at least one die electrically connected to the conductive bumps, and a molding compound encapsulating the conductive bumps.

13 Claims, 10 Drawing Sheets

(52) U.S. Cl.
CPC .... *H01L 23/3114* (2013.01); *H01L 23/49811* (2013.01); *H01L 23/49816* (2013.01); *H01L 23/49827* (2013.01); *H01L 23/562* (2013.01); *H01L 24/13* (2013.01); *H01L 23/49838* (2013.01); *H01L 2224/13012* (2013.01); *H01L 2224/13025* (2013.01); *H01L 2224/1412* (2013.01); *H01L 2924/3512* (2013.01)

(56) References Cited

U.S. PATENT DOCUMENTS

| | | | |
|---|---|---|---|
| 7,932,170 B1 * | 4/2011 | Huemoeller | H01L 21/4853 257/737 |
| 8,115,310 B2 * | 2/2012 | Masumoto | H01L 23/49811 257/737 |
| 8,390,116 B1 | 3/2013 | Huemoeller et al. | |
| 8,390,119 B2 * | 3/2013 | Lin | H01L 23/49838 257/738 |
| 2003/0092293 A1 * | 5/2003 | Ohtsuki | H01R 13/2414 439/66 |
| 2005/0017347 A1 | 1/2005 | Morimoto et al. | |
| 2008/0218979 A1 * | 9/2008 | Park | H05K 1/0206 361/712 |
| 2012/0326332 A1 | 12/2012 | Laurent | |
| 2013/0062761 A1 | 3/2013 | Lin et al. | |
| 2014/0167253 A1 * | 6/2014 | Tseng | H01L 23/5283 257/737 |
| 2015/0208517 A1 * | 7/2015 | Lee | H05K 3/4007 174/251 |

\* cited by examiner

SEMICONDUCTOR SUBSTRATE AND SEMICONDUCTOR PACKAGE STRUCTURE

CROSS REFERENCE TO RELATED APPLICATIONS

This application claims the benefit of P.R.C. (China) Patent Application No. 201410474198.7, filed 17 Sep. 2014, the contents of which are incorporated herein by reference in their entirety.

BACKGROUND

1. Technical Field

The present disclosure relates to a semiconductor substrate and a semiconductor package structure.

2. Description of the Related Art

Conductive bumps of a conventional semiconductor substrate may be electrically connected to conducting pillars of a die by a solder. The solder may randomly overflow to the outside of the conductive bumps and cause a short circuit between adjacent conducting pillars, or, if a conducting circuit is provided between the conductive bumps, a short circuit may occur between the conductive bumps and the conducting circuit. Additionally, solder on the conductive bumps in a ground area may overflow to a ground surface outside the conductive bumps because a ground layer and solder are both metallic materials, leaving less solder on the conductive bumps in the ground area, pulling the die closer to the substrate in the ground area than in other areas of the substrate. An uneven gap between the die and substrate may result, which may lead to a stress in the ground area that could produce a crack in the die.

SUMMARY

In an aspect, a semiconductor substrate includes an insulating layer, a first conductive patterned layer disposed adjacent to a first surface of the insulating layer, and conductive bumps disposed on the first conductive patterned layer. Each conductive bump has a first dimension along a first direction and a second dimension along a second direction perpendicular to the first direction, and the first dimension is greater than the second dimension. A semiconductor package structure includes the semiconductor substrate, at least one die electrically connected to the conductive bumps, and a molding compound encapsulating the conductive bumps.

In an aspect, a semiconductor package structure includes a semiconductor substrate, at least one die, and a molding compound. The semiconductor substrate includes an insulating layer, a first conductive patterned layer disposed adjacent to a first surface of the insulating layer, and conductive bumps disposed on the first conductive patterned layer. A first dimension of each conductive bump along a first direction is greater than a second dimension of the conductive bump along a second direction perpendicular to the first direction. The die is electrically connected to the conductive bumps. The molding compound encapsulates the conductive bumps.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are used to describe a certain component or certain plane of a component with respect to the orientation shown in the respective figure(s). It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
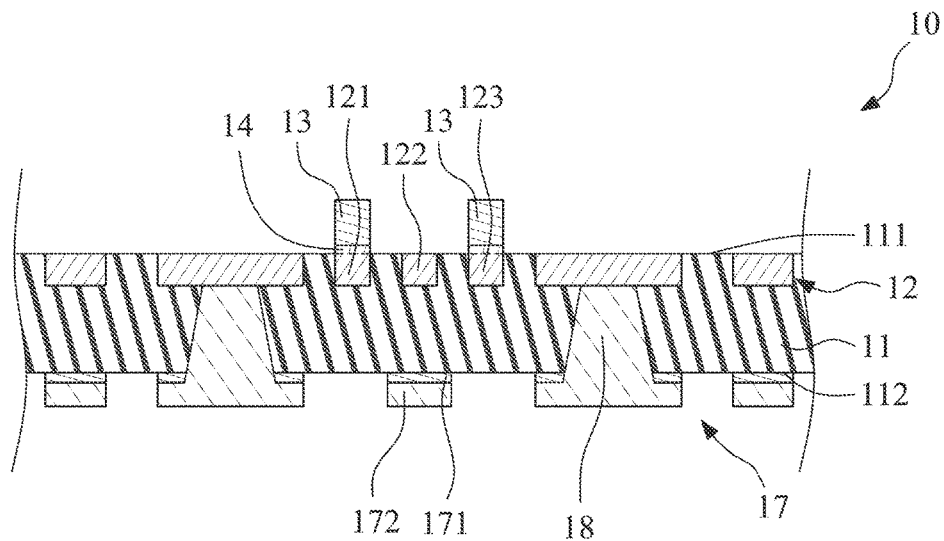
FIG. 1 is a partial cross-sectional view of a semiconductor substrate according to an embodiment.
Figure 2:
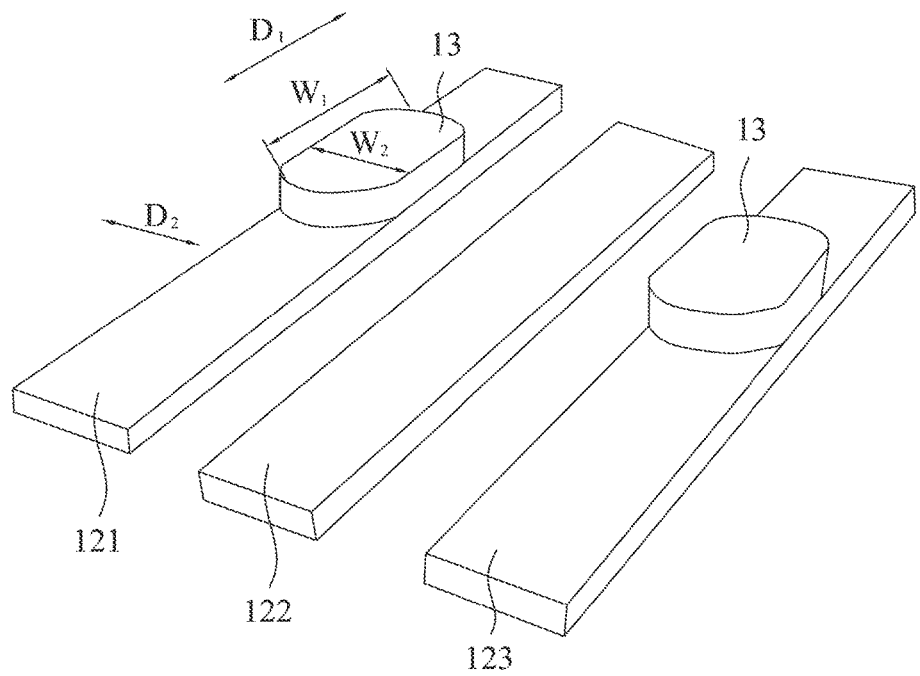
FIG. 2 is a perspective view of a first conductive patterned layer and conductive bumps according to an embodiment.

FIG. 1 is a partial cross-sectional view of a semiconductor substrate according to an embodiment. FIG. 2 is a perspective view of a first conductive patterned layer and conductive bumps according to an embodiment of FIG. 1. Referring to FIG. 1 and FIG. 2, the semiconductor substrate 10 includes an insulating layer 11, a first conductive patterned layer 12, and conductive bumps 13. The insulating layer 11 is, or includes, an insulating material or a dielectric material; for example, the insulating layer 11 may be, or may include, polypropylene. The insulating layer 11 has a first surface 111 and a second surface 112, and the second surface 112 is opposite the first surface 111.

The first conductive patterned layer 12 is disposed adjacent to the first surface 111 of the insulating layer 11. In an embodiment, the first conductive patterned layer 12 is embedded in or built into the first surface 111 of the insulating layer 11, and is exposed from the first surface 111 of the insulating layer 11. In an embodiment, the exposed surface of the first conductive patterned layer 12 is substantially coplanar with the first surface 111 of the insulating layer 11. The first conductive patterned layer 12 includes conductive traces 121, 122, 123. In an embodiment, a material of the first conductive patterned layer 12 is electroplated copper, and the first conductive patterned layer 12 is formed by using an electroplating process. In an embodiment, the semiconductor substrate 10 further includes a metal layer 14 disposed on the conductive traces 121, 123, and the conductive bumps 13 are located on the metal layer 14.

The semiconductor substrate 10 further includes a second conductive patterned layer 17 on the second surface 112 of the insulating layer 11. The second conductive patterned layer 17 is illustrated as not being embedded in or built into the second surface 112 of the insulating layer 11; however, in an embodiment, the second conductive patterned layer 17 is embedded in or built into the second surface 112 of the insulating layer 11. The second conductive patterned layer 17 includes conducting layer 171 and conductive traces 172. The conducting layer 171 is formed on the second surface 112, and the conductive traces 172 are formed on the conducting layer 171. The conducting layer 171 is a laminated copper foil formed by etching, and the conductive traces 172 are electroplated copper formed by using an electroplating process. The semiconductor substrate 10 further includes conductive vias 18 passing through the insulating layer 11 and electrically connected to the first conductive patterned layer 12 and the second conductive patterned layer 17.

FIG. 2 illustrates in isolation the conductive bumps 13 and portions of the conductive traces 121, 122, 123 of the first conductive patterned layer 12. The conductive bumps 13 (which may be, for example, copper pillars) are disposed on the first conductive patterned layer 12. The conductive bumps 13 are disposed on the respective conductive traces 121 and 123, and the conductive trace 122 is located between the conductive traces 121 and 123 and the corresponding two adjacent conductive bumps 13.

In an embodiment, the conductive bumps 13 have the same lattice as the first conductive patterned layer 12; meaning that the conductive bumps 13 and the first conductive patterned layer 12 are formed of a same material using a same technique. In an embodiment, the material of the conductive bumps 13 is electroplated copper, and the conductive bumps 13 are directly formed by electroplating on the first conductive patterned layer 12 or on the metal layer 14.

Each conductive bump 13 has a first dimension W1 (e.g., length) along a first direction D1, and a second dimension W2 (e.g., width) along a second direction D2 perpendicular to D1, where the first dimension W1 is larger than the second dimension W2, such as where a ratio of W1 to W2 is about 1.1 or greater, about 1.3 or greater, about 1.5 or greater, about 2 or greater, about 2.5 or greater, or about 3 or greater, and up to about 5 or more, or up to about 10 or more. In an embodiment, the conductive bump 13 is elliptically-shaped. The first direction D1 is substantially parallel with an extending or lengthwise direction of the conductive traces 121, 122, 123.

Figure 3:
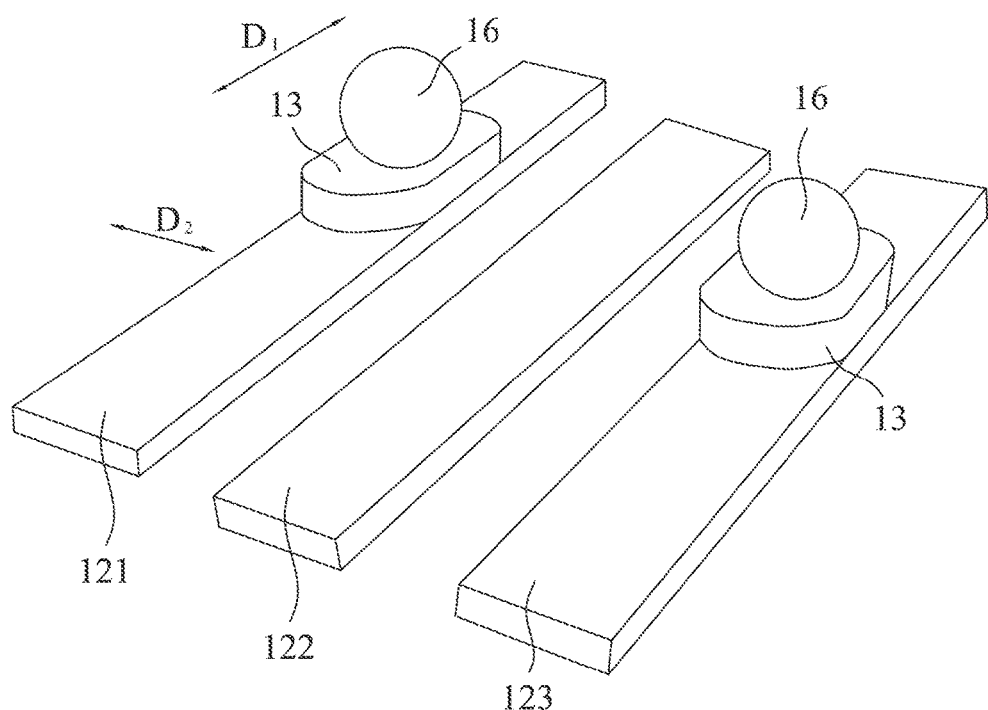
FIG. 3, FIG. 4 and FIG. 5 illustrate a method of distributing solder on conductive bumps according to an embodiment.
Figure 4:
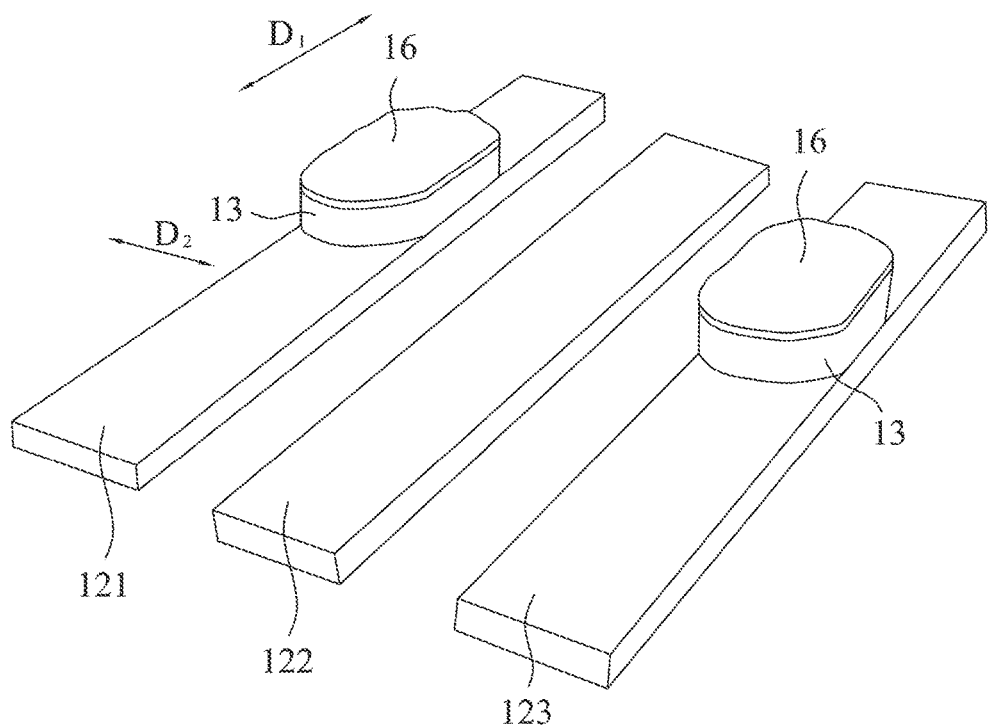
Figure 5:
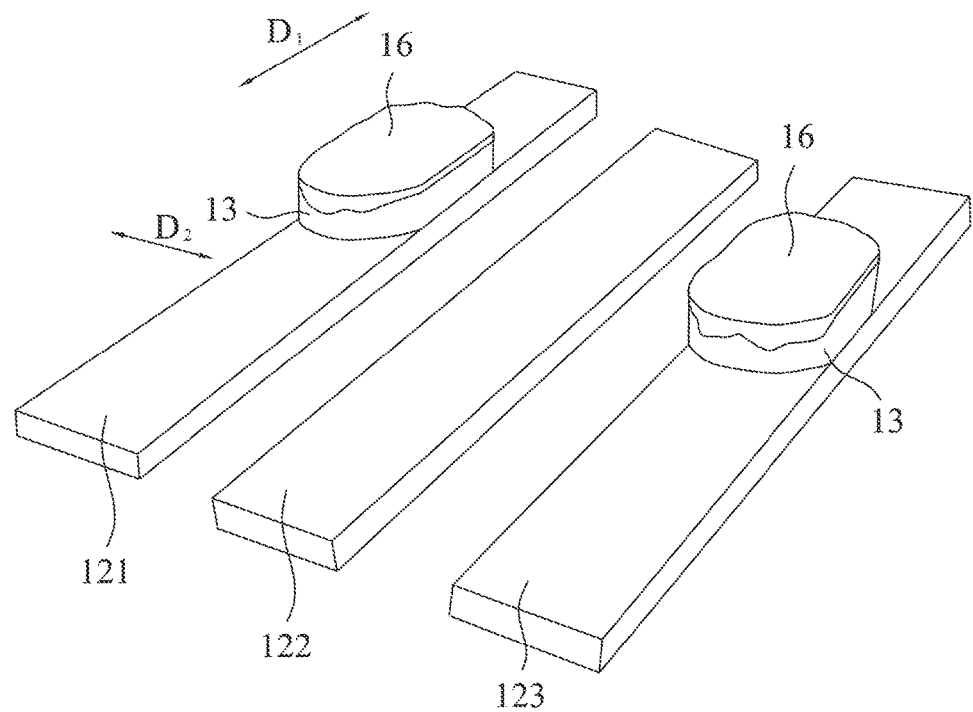

FIG. 3 to FIG. 5 are perspective views of a method according to an embodiment, such as for a flip-chip attachment of a die on the substrate 10. FIG. 3 illustrates a solder 16 distributed on the conductive bumps 13. FIG. 4 illustrates that, when heated, the solder 16 may flow on the surface of the conductive bump 13 and cover the surface of the conductive bump 13. Because the first dimension W1 of the conductive bump 13 is larger than the second dimension W2, the amount of the solder 16 flowing in the direction along the first dimension W1 is increased as compared to a circularly-shaped solder area, so that the solder 16 is distributed on the surface of the conductive bump 13 and may not overflow to the outside of the conductive bump 13. Accordingly, even if the distances between the conductive traces 121, 122, 123 are small (e.g., fine pitch traces), short circuits may be avoided between the conductive traces 121, 122, 123, thereby improving product reliability.

FIG. 5 illustrates that, if the solder 16 does overflow, the solder 16 will flow predominantly in the first direction D1, down the side of the conductive bump 13, and to the respective conductive trace 121 or 123. Therefore, an amount of the solder 16 overflowing towards the adjacent conductive trace 122 is reduced, and the probability of short circuits between the conductive traces 121, 122, 123 due to overflow of the solder 16 is reduced. As can be seen, by extending the conductive bump 13 along the first direction D1 substantially parallel with the adjacent conductive trace 122, the solder 16 is controlled to flow predominantly in the first direction D1 and the amount of the solder 16 flowing toward the adjacent conductive trace 122 is reduced, reducing a probability of a short circuit caused by bridging between the solder 16 and the conductive trace 122.

Figure 6:
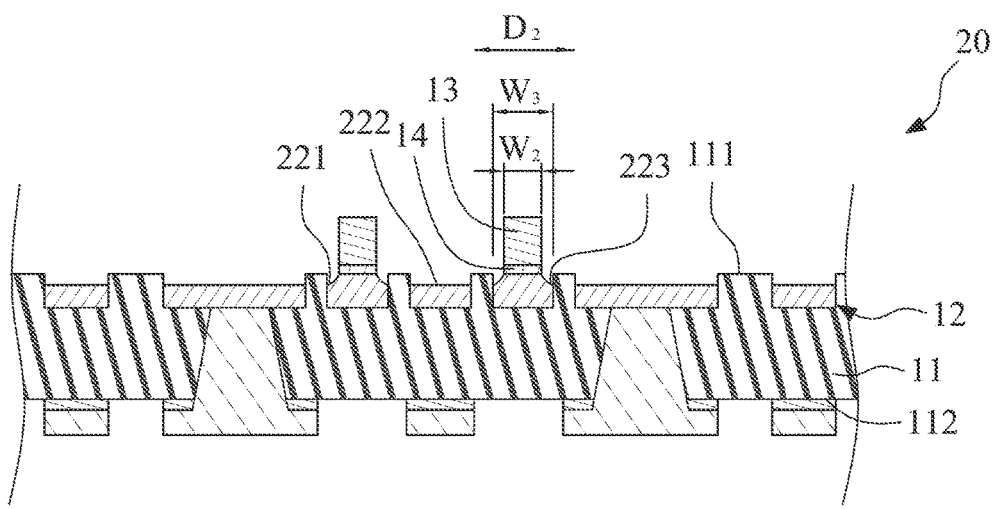
FIG. 6 is a partial cross-sectional view of a semiconductor substrate according to an embodiment.

FIG. 6 is a partial cross-sectional view of a semiconductor substrate 20 according to an embodiment. The semiconductor substrate 20 of FIG. 6 is similar to the semiconductor substrate 10 of FIG. 1, except that the first conductive patterned layer 12 includes conductive traces 221, 222, 223, and the first conductive patterned layer 12 is recessed relative to the first surface 111 of the insulating layer 11, that is, as illustrated, the exposed surface of the first conductive patterned layer 22 is lower than the first surface 111 of the insulating layer 11. In a further difference from the semiconductor substrate 10, the conductive traces 221, 223, each has a dimension W3 in the second direction D2 that is greater than the second dimension W2 of each conductive bump 13. In a fashion similarly to that described with respect to FIGS. 1-5, if the solder 16 overflows conductive bump 13, it will overflow predominantly in the direction D1 perpendicular to the direction D2, If the solder 16 also overflows in the direction D2, the solder 16 may overflow onto the conductive traces 221, 223 separated from the conductive trace 222 by the portions of the insulating layer 11 that extend beyond the first conductive patterned layer 12. Thus, unwanted bridges between the conductive traces 221, 222, 223 due to overflow of the solder 16 may be reduced or avoided.

Figure 7:
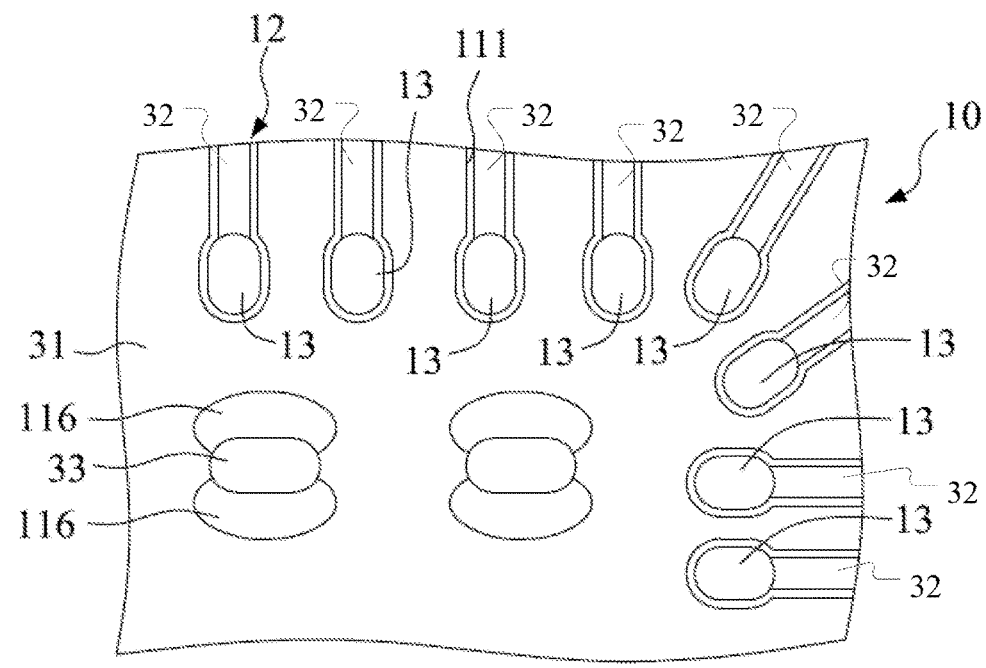
FIG. 7 is a partial top view of the semiconductor substrate according to an embodiment.
Figure 8:
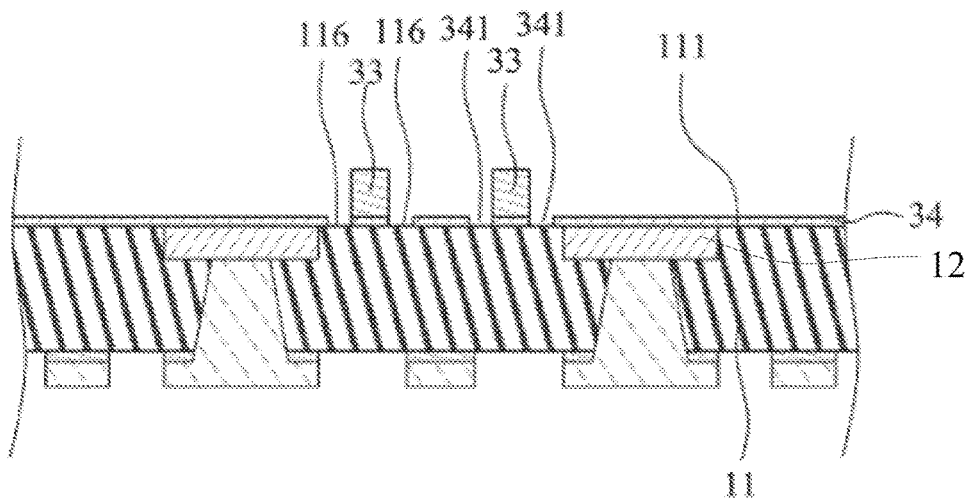
FIG. 8 is a partial cross-sectional view of the semiconductor substrate in a ground area of FIG. 7 according to an embodiment.
Figure 9:
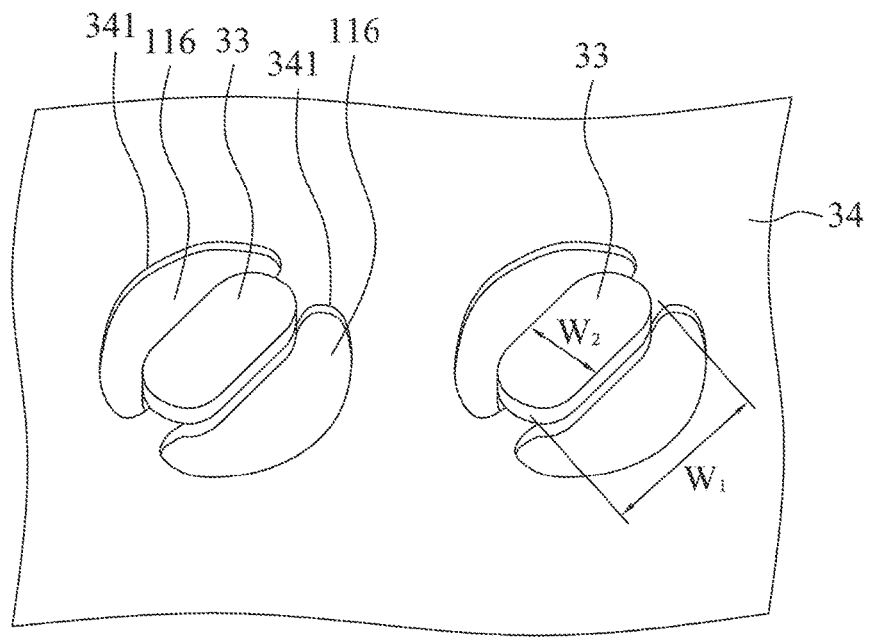
FIG. 9 is a perspective view of the conductive bumps in the ground area of FIG. 7 according to an embodiment.

FIG. 7 is a top view of a ground area 31 of the semiconductor substrate 10 of FIG. 1 according to an embodiment, also illustrating circuits 32 at a periphery of the ground area 31. FIG. 8 is a partial cross-sectional view of the semiconductor substrate 10 in the ground area 31 according to an embodiment. FIG. 9 is a perspective view of the conductive bumps in the ground area 31 of FIG. 8 according to an embodiment.

The ground area 31, for example, may be located near a center of the semiconductor substrate 10. One or more conductive bumps 13 may be disposed on the circuits 32. One or more conductive bumps 33 are disposed in the ground area 31. A ground layer 34 (FIG. 8) is disposed on the insulating layer 11 in the ground area 31. The ground layer 34 is electrically connected to the conductive bumps 33 in the ground area 31. An insulating area 116 is provided on two sides of each conductive bump 33. The insulating areas 16 are defined by openings 341 in the ground layer 34. The openings 341 expose portions of the first surface 111 of the insulating layer 11. The openings 341 and the exposed portions of the insulation layer 11 form the insulating areas 116.

The conductive bumps 33 disposed in the ground area 31 have substantially the same shape and dimensions as the conductive bumps 13 disposed on the conductive traces 121, 123 in FIG. 1 and FIG. 2. Therefore, the amount of solder (e.g., solder 16) on the conductive bumps 33 in the ground area 31 is approximately the same as the solder on the conducting bumps 13 on the circuits 32. Therefore, when the substrate 10 is connected to a die, the situation described above regarding an uneven gap between the substrate 10 and the die may be reduced or avoided.

The insulating area 116 and the solder are of different materials, and the insulating area 116 suppresses the flow of the solder. Thus, if the solder on the conductive bump 33 does overflow to the outside of the conductive bump 33, the majority of the solder will remain on the conductive bump 33, and the situation of uneven gap occurring is reduced or avoided.

By reducing or avoiding the situation of uneven gaps, die cracks caused by a stress produced in a ground area may be reduced or avoided.

Figure 10:
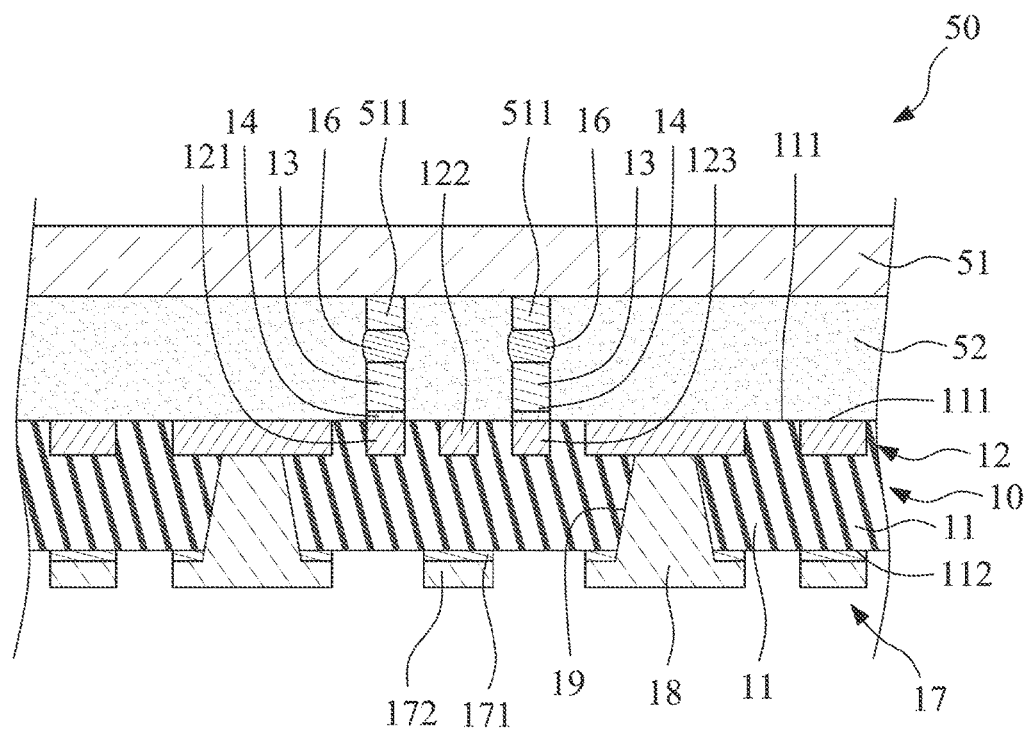
FIG. 10 is a partial cross-sectional view of a semiconductor package structure according to an embodiment.

FIG. 10 is a partial cross-sectional view of a semiconductor package structure 50 according to an embodiment. The semiconductor package structure 50 includes: a semiconductor substrate 10, at least one die 51, and a molding compound 52. The structure of the semiconductor substrate 10 is as described with respect to FIG. 1 and FIG. 2 The die 51 is electrically connected to the conductive bumps 13 of the semiconductor substrate 10.

The die 51 includes conducting pillars 511, which are electrically connected to the conductive bumps 13 by the solder 16. The molding compound 52 is filled between the die 51 and the semiconductor substrate 10, thereby surrounding the conductive bumps 13 of the semiconductor substrate 10, the conducting pillars 511 of the die 51, and the solder 16.

Figure 11:
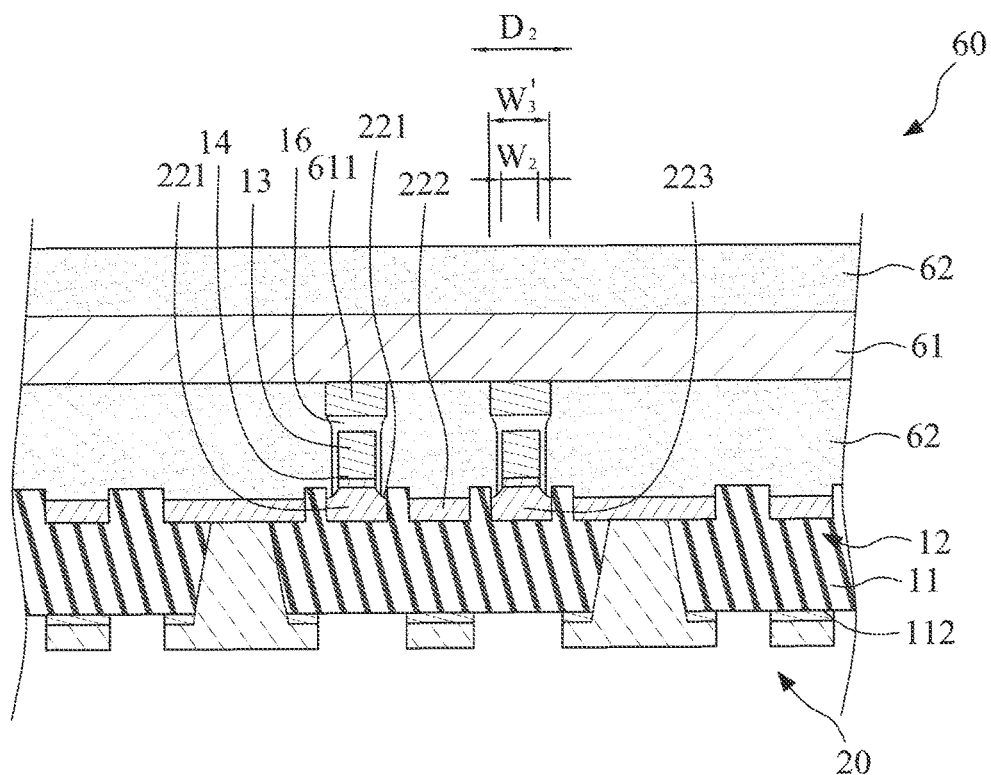
FIG. 11 is a partial cross-sectional view of a semiconductor package structure according to an embodiment.

FIG. 11 is a partial cross-sectional view of a semiconductor package structure 60 according to an embodiment. The semiconductor package structure 60 includes: a semiconductor substrate 20, at least one die 61, and a molding compound 62. The structure of the semiconductor substrate 20 is as described with respect to FIG. 6, where the second dimension W2 of each conductive bump 13 is smaller than the dimension W3 of each of the conductive traces 221, 223. The die 61 is electrically connected to the conductive bumps 13 of the semiconductor substrate 20

The die 61 includes conducting pillars 611, which are electrically connected to the conductive bumps 13 by the solder 16. The conducting pillar 611 has a dimension W3' in the direction D2, which is approximately the same as the dimension W3 of each of the conductive traces 221, 223. The second dimension W2 of each conductive bump 13 is smaller than the dimension W3 of each of the conductive traces 221, 223, and is smaller than the dimension W3' of each conducting pillar 611. As described above, if solder 16 overflows, it will overflow in the first direction D1 to the surface of the conductive trace 221 or 223 connected to the conductive bump 13. There may also be an overflow in the second direction D2; because the dimension W3 of each of the conductive traces 221, 223 is larger than the second dimension W2 of each conductive bump 13, the solder 16 overflows to the surface of the conductive traces 221 or 223 not covered by conductive bump. Additionally, because the first conductive patterned layer 12 is recessed relative to the first surface 111 of the insulating layer 11, the solder 16 is prevented from flowing to the adjacent conductive trace 222. Further, because the dimension W3' of each conducting pillar 611 is larger than the second dimension W2 of each conductive bump 13, a portion of the solder 16 may remain on the conducting pillars 611 instead of overflowing to the sides of the conductive bumps 13. Therefore, short circuits between the conductive bumps or short circuits between the conductive bumps and the adjacent conductive trace(s) due to overflow of the solder 16 can be avoided.

Figure 12:
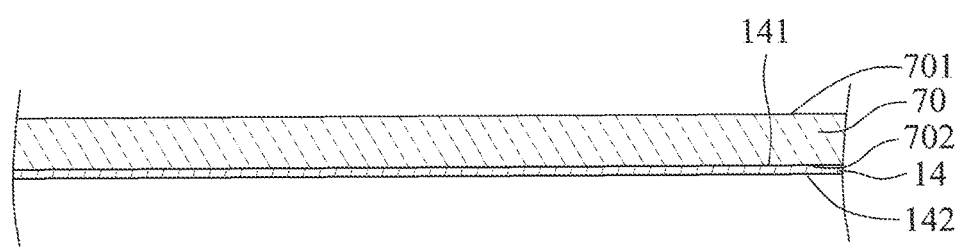
FIG. 12, FIG. 13, FIG. 14, FIG. 15, FIG. 16, FIG. 17, FIG. 18, FIG. 19 and FIG. 20 illustrate a method for fabricating the semiconductor substrate in FIG. 1 according to an embodiment.

FIGS. 12-20 illustrate a method for fabricating the semiconductor substrate according to an embodiment. Referring to FIG. 12, a carrier 70 is provided, and the carrier 70 has a first surface 701 and a second surface 702. A metal layer 14 is formed on the second surface 702 of the carrier 70. In an embodiment, the metal layer 14 is a copper foil. The metal layer 14 has a first surface 141 and a second surface 142. The first surface 141 of the metal layer 14 is laminated or adhered to the second surface 702 of the carrier 70.

Figure 13:
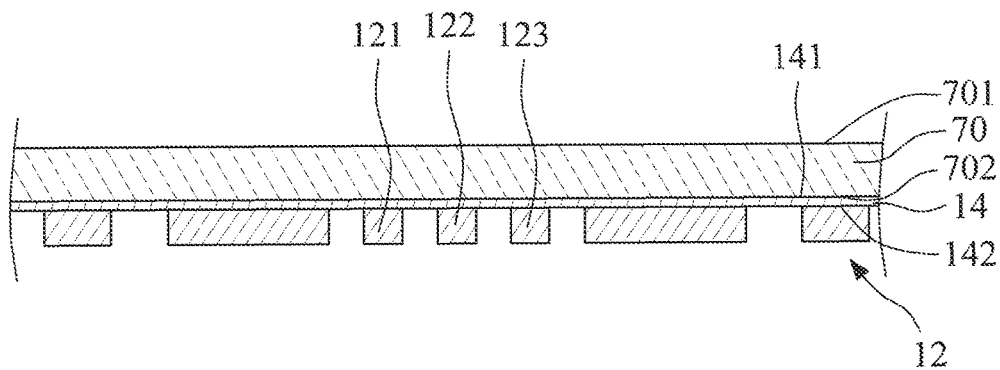

Referring to FIG. 13, the first conductive patterned layer 12 is formed on the metal layer 14. In an embodiment, the material of the first conductive patterned layer 12 is electroplated copper, which is formed by using an electroplating process on the second surface 142 of the metal layer 14. The first conductive patterned layer 12 includes conductive traces 121, 122, 123. In an embodiment, the distance between the conductive trace 121 and the adjacent conductive trace 122 is smaller than about 25 μm.

Figure 14:
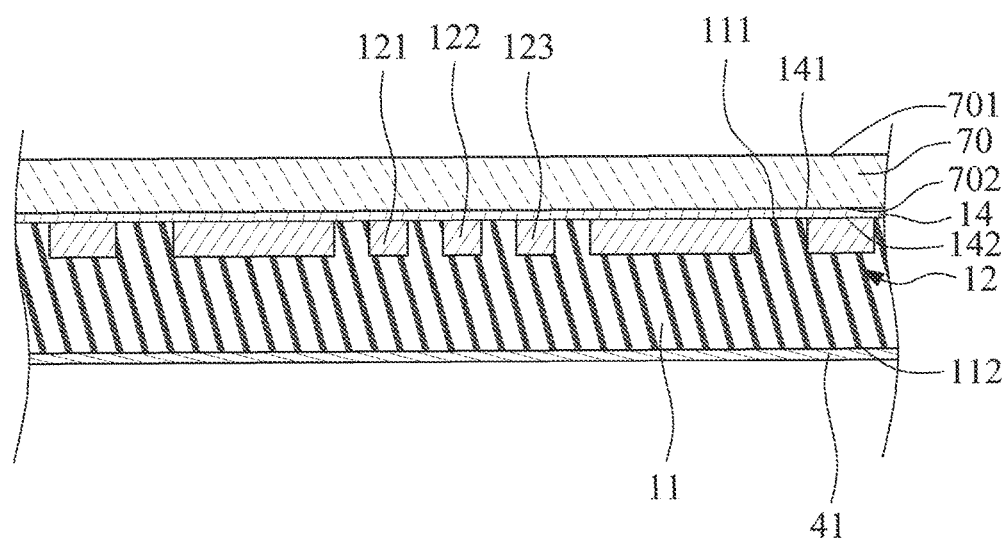

Referring to FIG. 14, an insulating layer 11 is formed on the first conductive patterned layer 12 and the metal layer 14. The insulating layer 11 is made of an insulating material or a dielectric material (e.g., polypropylene), and is attached to the first conductive patterned layer 12 and the metal layer 14 by using a lamination technology. As shown in FIG. 14 after lamination, the insulating layer 11 has a first surface 111 and a second surface 112, the first surface 111 of the insulating layer 11 contacts the second surface 142 of the metal layer 14, and the first conductive patterned layer 12 is embedded in or built into the first surface 111 of the insulating layer 11. A metal layer 41 is formed on the second surface 112 of the insulating layer 11. In an embodiment, the metal layer 41 is a copper foil, and is laminated or adhered to the second surface 112 of the insulating layer 11.

Figure 15:
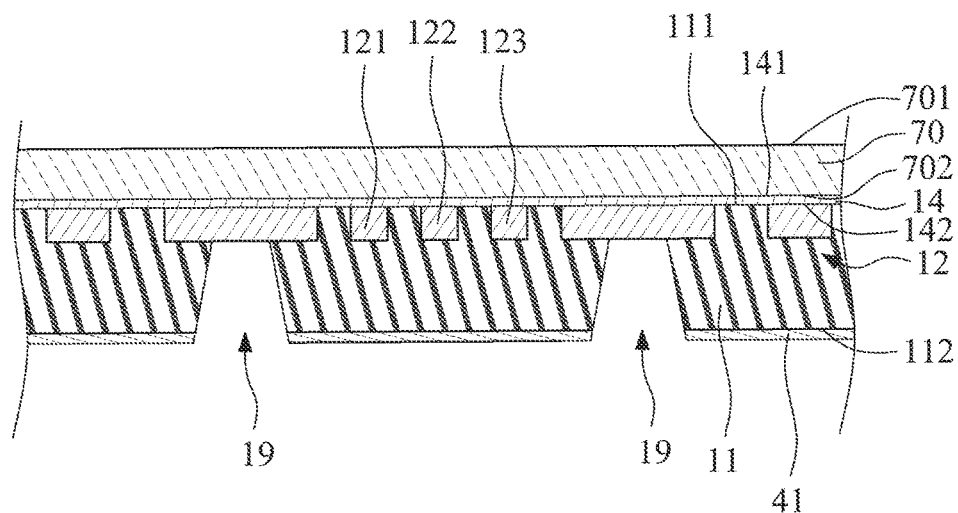

Referring to FIG. 15, through holes 19 are formed to pass through the metal layer 41 and the insulating layer 11, to expose a portion of the first conductive patterned layer 12. In an embodiment, the through holes 19 are formed by laser drilling.

Figure 16:
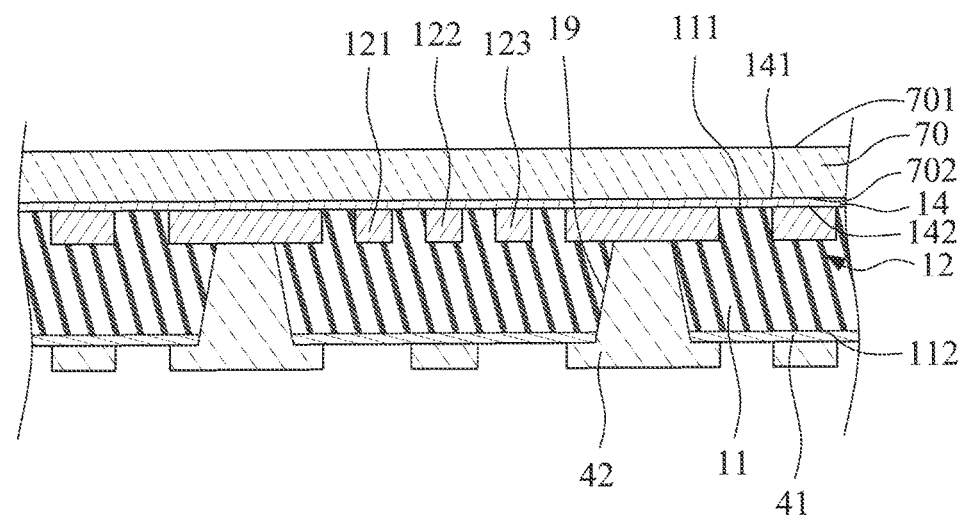

Referring to FIG. 16, in an embodiment, a metal 42 is filled in the through holes 19 to form conductive vias 18, and the metal 42 is further formed into a patterned metal layer 17' on the metal layer 41. In another embodiment, the conductive vias 18 and the patterned metal layer 17' may be formed in different processing stages. The conductive vias 18 pass through the insulating layer 11 and the metal layer 41, and contact the first conductive patterned layer 12. The metal 42 covers a portion of the metal layer 41 and exposes another portion of the metal layer 41. In an embodiment, the metal 42 is electroplated copper and is formed by electroplating.

Figure 17:
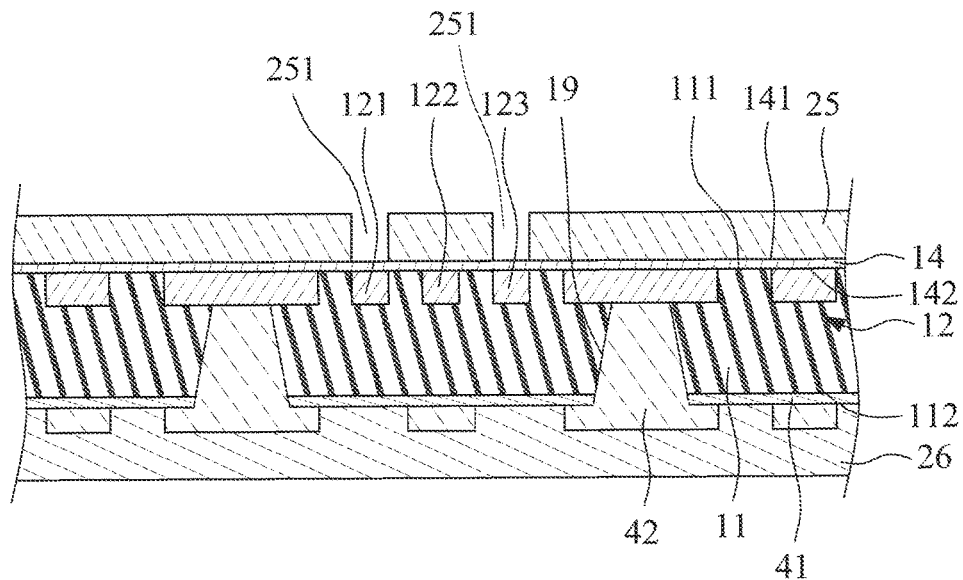

Referring to FIG. 17, the carrier 70 is removed. In an embodiment, the carrier 70 is removed by stripping to expose portions of the metal layer 14. The metal layer 14, the insulating layer 11, the first conductive patterned layer 12, the conductive vias 18, the metal layer 41, and the metal 42 form a built-in circuit substrate.

A first photoresist layer 25 is formed on the metal layer 14. A second photoresist layer 26 is formed on the metal layer 41 and the metal 42 The first photoresist layer 25 defines openings 251 relative to the conductive traces 121, 123, exposing portions of the metal layer 14. The first photoresist layer 25 and the second photoresist layer 26 may be, for example, dry films.

Figure 18:
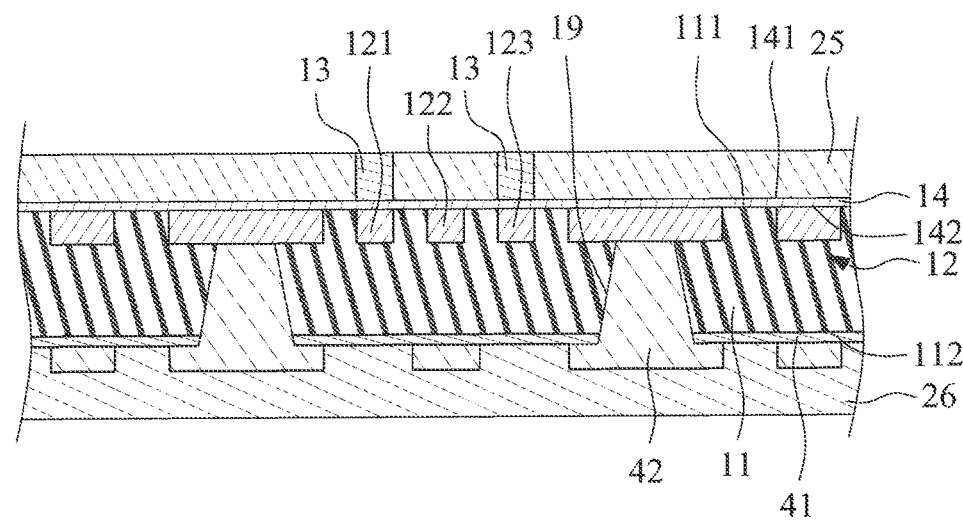

Referring to FIG. 18, conductive bumps 13 are formed in the openings 251 of the first photoresist layer 25. In an embodiment, the material of the conductive bumps 13 is electroplated copper, and is formed by electroplating on the exposed metal layer 14.

Figure 19:
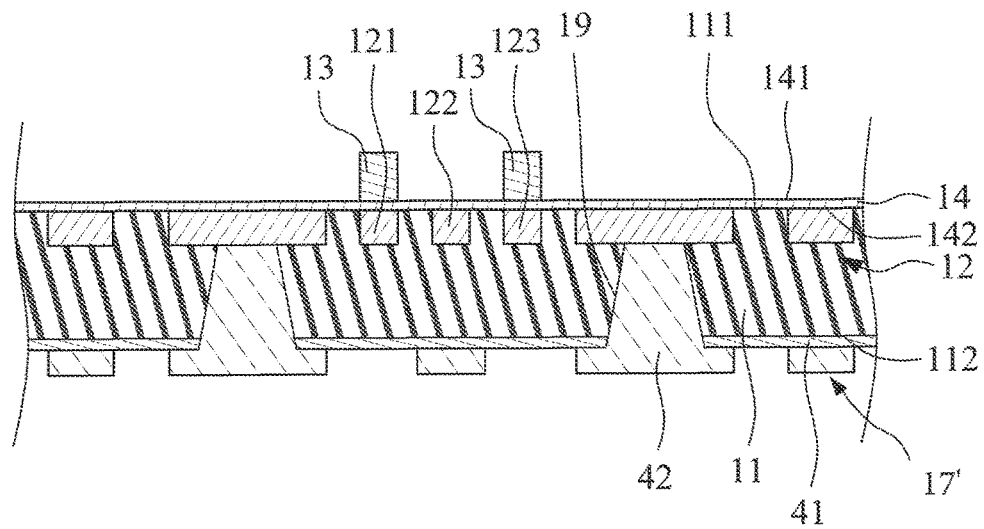
Figure 20:
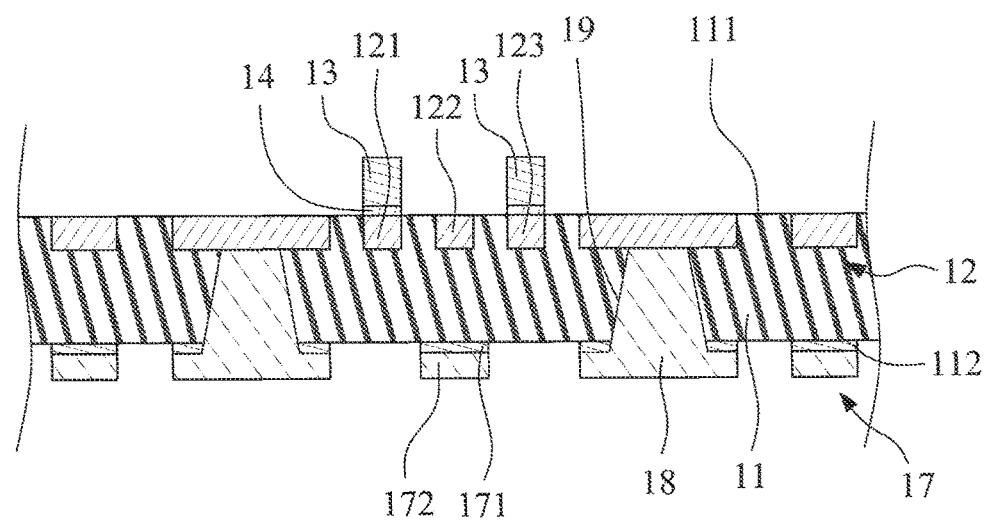

Referring to FIG. 19, the first photoresist layer 25 and the second photoresist layer 26 are removed. Referring to FIG. 20, the metal layer 14 not covered by the conductive bumps 13 is removed by etching, and the metal layer 41 not covered by the metal 42 is removed by etching, to form a second conductive patterned layer 17 which includes conducting layer 171 and at least one second conductive trace 172. As illustrated in FIG. 20, the second conductive patterned layer 17 is disposed on the surface 112 of the insulating layer 11. In other embodiments, further layers may be added (not shown) such that the second conductive patterned layer 17 is embedded or built into an insulating layer.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. By way of further examples, two surfaces can be deemed to be coplanar or substantially coplanar if a displacement between the two surfaces is no greater than 5 μm, no greater than 2 μm, no greater than 1 μm, or no greater than 0.5 μm; the terms "substantially the same" or "approximately the same" in the context of dimensions can refer to a difference no greater than about 5 μm, no greater than 2 μm, no greater than 1 μm, or no greater than 0.5 μm; and the term "substantially parallel" with respect to two edges or surfaces can refer to lying along a line or along a plane, with an angular displacement between the two edges or surfaces being less than or equal to 10°, such as less than or equal to 5°, less than or equal to 3°, less than or equal to 2°, or less than or equal to 1°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A substrate for a semiconductor package structure, comprising:
an insulating layer having a first surface;
a first conductive patterned layer recessed relative to the first surface of the insulating layer, the first conductive patterned layer comprising a plurality of conductive traces; and
a plurality of conductive bumps disposed on the first conductive patterned layer, wherein each conductive bump has a first dimension along a first direction substantially parallel to a respective conductive trace and a second dimension along a second direction perpendicular to the first direction, the first dimension is greater than the second dimension, the second dimension of the conductive bump is smaller than a width of the conductive trace along an entirety of the conductive bump; and only a portion of the conductive trace is recessed below the first surface of the insulating layer.

2. The substrate according to claim 1, wherein at least one conductive trace is provided between every two adjacent conductive bumps.

3. The substrate according to claim 1, wherein the first conductive patterned layer is embedded in the first surface of the insulating layer.

4. The substrate according to claim 1, further comprising a second conductive patterned layer and a plurality of conductive vias, wherein the second conductive patterned layer is disposed on a second surface of the insulating layer, the second surface is opposite the first surface, and the conductive vias pass through the insulating layer and are electrically connected to the first conductive patterned layer and the second conductive patterned layer.

5. The substrate according to claim 4, wherein the second conductive patterned layer comprises a plurality of layers.

6. The substrate according to claim 5, wherein the second conductive patterned layer further comprises at least one conductive trace.

7. A semiconductor package structure, comprising:
a substrate, comprising:
an insulating layer;
a plurality of conductive traces disposed adjacent to a first surface of the insulating layer; and
a plurality of conductive bumps disposed on respective ones of the conductive traces, each conductive bump having a first dimension along a lengthwise direction of a respective conductive trace and a second dimension along a second direction perpendicular to the lengthwise direction, the first dimension being greater than the second dimension, and the second dimension of the conductive bump being smaller than a width of the conductive trace along an entirety of the conductive bump; and only a portion of the conductive trace is recessed below the first surface of the insulating layer;
at least one solder;
at least one die including at least one conducting pillar, the die electrically connected to the conductive bumps by the solder between the conducting pillar of the die and at least one of the conductive bumps; and a molding compound, encapsulating the conductive bumps.

8. The semiconductor package structure according to claim 7, wherein at least one conductive trace is provided between two adjacent conductive bumps.

9. The semiconductor package structure according to claim 7, wherein the conductive traces are embedded in the first surface of the insulating layer.

10. The semiconductor package structure according to claim 9, wherein the conductive traces are recessed relative to the first surface of the insulating layer.

11. The semiconductor package structure according to claim 7, wherein the at least one die comprises a plurality of conducting pillars electrically connected to respective ones of the conductive bumps, and a dimension of each conducting pillar in the second direction is greater than the second dimension of the respective conductive bump.

12. A substrate for a semiconductor package structure, comprising:
- an insulating layer;
- a first conductive patterned layer disposed adjacent to a first surface of the insulating layer, the first conductive patterned layer comprising a plurality of conductive traces;
- a first conductive bump disposed on the first conductive patterned layer, wherein the first conductive bump has a first dimension along a first direction substantially parallel to a conductive trace of the plurality of conductive traces and a second dimension along a second direction perpendicular to the first direction, and the first dimension is greater than the second dimension;
- a plurality of second conductive bumps; and
- a ground plate disposed on the insulating layer, wherein each of the second conductive bumps is disposed on and electrically connected to the ground plate, the ground plate comprising a metallic material, a plurality of openings in the ground plate expose portions of the insulating layer, and the openings and the exposed portions of the insulating layer define an insulating area adjacent to two sides of each of the second conductive bumps in the ground plate.

13. The substrate according to claim 1, further comprising a metal layer between at least one conductive bump of the plurality of conductive bumps and at least one conductive trace among the plurality of conductive traces, wherein the metal layer directly contacts a bottom surface of the at least one conductive bump and a top surface of the at least one conductive trace, and a width of the metal layer is smaller than a width of the at least one conductive trace.

* * * * *